(12) United States Patent
Blanchard et al.

(10) Patent No.: US 8,310,006 B2
(45) Date of Patent: Nov. 13, 2012

(54) DEVICES, STRUCTURES, AND METHODS USING SELF-ALIGNED RESISTIVE SOURCE EXTENSIONS

(75) Inventors: Richard A. Blanchard, Los Altos, CA (US); Mohamed N. Darwish, Campbell, CA (US); Jun Zeng, Torrance, CA (US)

(73) Assignee: MaxPower Semiconductor, Inc., Santa Clara, CA (US)

( * ) Notice: Subject to any disclaimer, the term of this patent is extended or adjusted under 35 U.S.C. 154(b) by 141 days.

(21) Appl. No.: 12/887,303

(22) Filed: Sep. 21, 2010

(65) Prior Publication Data

US 2011/0193131 A1    Aug. 11, 2011

Related U.S. Application Data

(60) Provisional application No. 61/244,364, filed on Sep. 21, 2009.

(51) Int. Cl.
*H01L 29/66* (2006.01)

(52) U.S. Cl. ... 257/335; 257/257; 257/336; 257/E29.027
(58) Field of Classification Search ................ 257/139, 257/335
See application file for complete search history.

(56) References Cited

U.S. PATENT DOCUMENTS

| | | | |
|---|---|---|---|
| 2005/0167742 A1* | 8/2005 | Challa et al. | 257/328 |
| 2008/0026529 A1* | 1/2008 | White et al. | 438/275 |
| 2008/0087956 A1* | 4/2008 | Blanchard | 257/335 |

FOREIGN PATENT DOCUMENTS

EP          267447 A2 *  5/1988
* cited by examiner

*Primary Examiner* — Ajay K Arora
(74) *Attorney, Agent, or Firm* — Robert O. Groover, III

(57) ABSTRACT

Devices, structures, and related methods for IGBTs and the like which include a self-aligned series resistance at the source-body junction to avoid latchup. The series resistance is achieved by using a charged dielectric, and/or by using a dielectric which provides a source of dopant atoms of the same conductivity type as the source region, at a sidewall adjacent to the source region.

15 Claims, 10 Drawing Sheets

DEVICES, STRUCTURES, AND METHODS USING SELF-ALIGNED RESISTIVE SOURCE EXTENSIONS

CROSS-REFERENCE

Priority is claimed from U.S. application Ser. No. 61/244,364 Sep. 21, 2009, which is hereby incorporated by reference. Priority is also claimed from 12/391,450 filed Feb. 24, 2009, which is also hereby incorporated by reference.

BACKGROUND

The present application relates to switchable field-effect-gated power semiconductor devices which include bipolar conduction, such as IGBTs (insulated-gate bipolar transistors), Gate Turn-off thyristors GTOs and the like.

Note that the points discussed below may reflect the hindsight gained from the disclosed inventions, and are not necessarily admitted to be prior art.

MOS-gated power devices such as power DMOS transistors and IGBTs are capable of supplying large currents while withstanding voltages as high as 600 to 1500 Volts, or even more. The power dissipation of a power device is the product of the on-state voltage drop across the device times the current flow through it. The combination of high voltage across a MOS-gated power device and the high current through it may cause unwanted local heating, which can lead to device failure. While any MOS-gated device can fail if it is exposed to excessive voltage or excessive current, it is possible to increase the ability of such devices to withstand such conditions. The present application will describe such a technique below, using an n-channel IGBT as an example.

A cross section of a typical n-channel IGBT is shown in FIG. 3A. As seen in these figures, the IGBT is a four layer device. In this example, an insulated gate 120A inverts a surface (channel) portion of p-type body/emitter region 116A. (Region 116A will typically have some gradation in doping, corresponding at least to the usual combination of a shallow body implant with a deep body implant, but this gradation is well-known and is not illustrated as such.) Electrons thus emitted from source region 130A pass into drift/drain region 114 (provided by an epitaxial layer in this example) into an n+ deep drain region 112. The n+ region 112 forms a base/emitter junction with the p+ substrate 110, to thereby control hole emission, which provides hole current between collector contact 103 and emitter/source contact 102.

FIG. 3B shows a simple equivalent circuit for the device of FIG. 3A. The MOSFET transistor M1 provides the base current to the PNP bipolar transistor T1, as described above. However, this equivalent circuit is slightly oversimplified, as will now be described.

Some four layer devices, such as SCRs, display "latch-up" characteristic in their normal operation. (A latch-up condition means that the device will stay on for as long as the current is above some minimum "holding current" value, or until the device is destroyed.) However, one of the basic requirements of an IGBT is that latch-up should not occur at any time during normal operation. Both the structure of an IGBT and the processing sequence used to fabricate an IGBT are tailored to prevent latch-up from occurring.

One of the methods which may be used to prevent latch-up is understood by referring to the models of an IGBT shown in FIG. 4A. This model includes the MOS transistor M1 and bipolar transistor T1 shown in FIG. 3B, and also shows the parasitic NPN bipolar transistor T2 formed by the N+ source region 130A, the P-type body region 116A, and the N-type drain regions 112/114 of the DMOS FET present in the IGBT. If the four layer structure in the IGBT is to turn "on," the emitter-to-base junction of the NPN bipolar transistor must become forward biased. It requires a voltage of approximately 0.6 Volts to forward bias this pn-junction. Since the emitter and base regions of this NPN bipolar are shorted at one or more locations in the IGBT, there must be a sufficiently large current flow through the resistance present in the body region to reach a body-to-source voltage (and hence, a base-to-emitter voltage) of 0.6 volts at any region in the IGBT.

FIG. 4B is based on FIG. 4A, but explicitly shows the emitter resistance in the parasitic bipolar T2. When an IGBT is conducting in normal operation, the peak base-to-emitter voltage is determined by the parasitic body resistance $R_b$, and the current $I_b$ that is flowing through it, in combination with the peak emitter resistance $R_e$, and the current $I_e$ that is flowing through it. This voltage is just $$V_{be} = R_b I_b - R_e I_e.$$

From this equation, it can be seen that the presence of additional resistance in the source (which forms the emitter of the NPN bipolar transistor), provides a debiasing effect, and thereby increases the voltage that must be present across the body resistance $R_b$ before the base-to-emitter junction of the NPN bipolar transistor becomes forward biased.

SUMMARY

The present application discloses new approaches to switchable field-effect-gated semiconductor devices which include bipolar conduction. The present inventors have realized that a series resistance can be introduced in the field-effect portion of the device, by (e.g.) using a self-aligned structure which results in a series resistance being added into the source side of the source/body junction. The present application discloses devices and methods in which a source extension provides additional series resistance between the source region and the channel. This series resistance, in various embodiments, is provided by an immobile electrostatic charge and/or by outdiffusion from a doped dielectric. In either case, this series resistance advantageously increases the critical current which will trigger latch-up and results in large electrical short circuit Safe Operating Area (SOA).

In some embodiments, extremely shallow source extension formed by these methods provide a way to scale device cell pitch that reduces on-resistance and approaches its theoretical performance limit.

The disclosed innovations, in various embodiments, provide one or more of at least the following advantages. However, not all of these advantages result from every one of the innovations disclosed, and this list of advantages does not limit the various claimed inventions.

Improved resistance to latch-up;
Scaling an IGBTs cell pitch can approach theoretical limits for on-resistance.
IGBT devices can have a large electrical short circuit Safe Operating Area (SOA);
Greater reliability in the field;
Increased ruggedness in an IGBT (due to increases in the point at which the intrinsic NPN transistor in the structure becomes active, which in turn increases the current at which gate control of the device is lost); and/or
Increased gain of the IGBT (by increasing the gain of the PNP, without decreasing the current at which gate control of the device is lost).

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

The present application describes numerous device structures which use novel source extension structures to obtain improved latch up performance. The present application also describes a number of different techniques which can be used to introduce such additional resistance in the source of the transistor in an area efficient manner. In addition, the value of the additional resistance that is introduced can be made different in different devices, thereby allowing the characteristic of specific IGBTs to be adjusted to match the requirements of specific applications. These two different techniques are explained below and their application to both conventional planar DMOS IGBTs and to newer, denser, trench-gated IGBTs is discussed.

Induced Source Extension

Figure 1A:
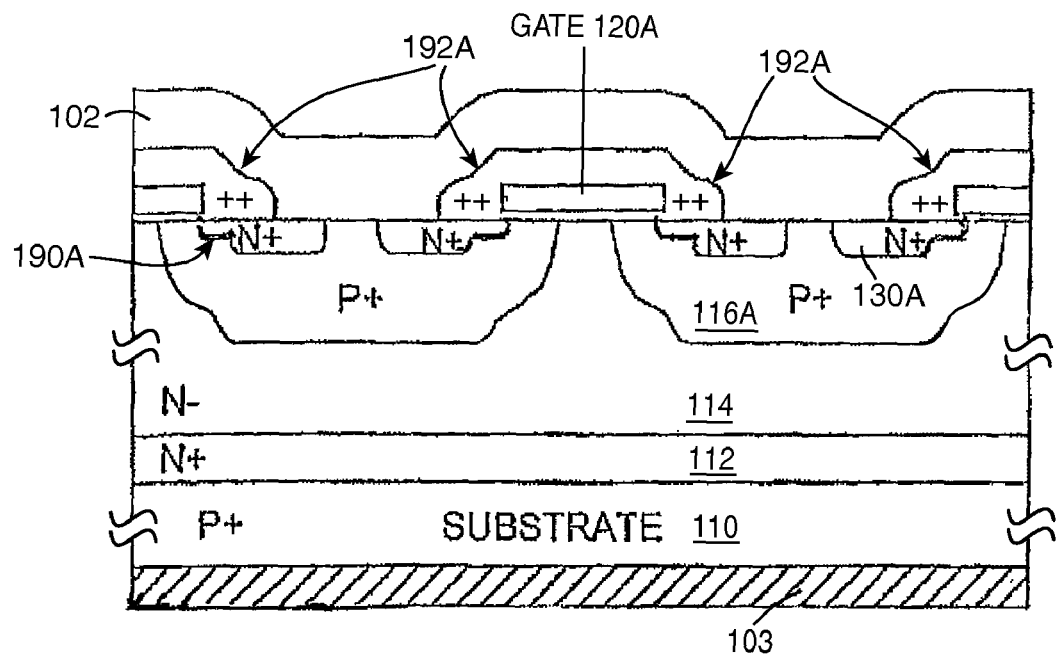
FIG. 1A shows an IGBT with a planar gate and a resistive source extension induced by immobile net electrostatic charge in a dielectric sidewall filament.
Figure 1B:
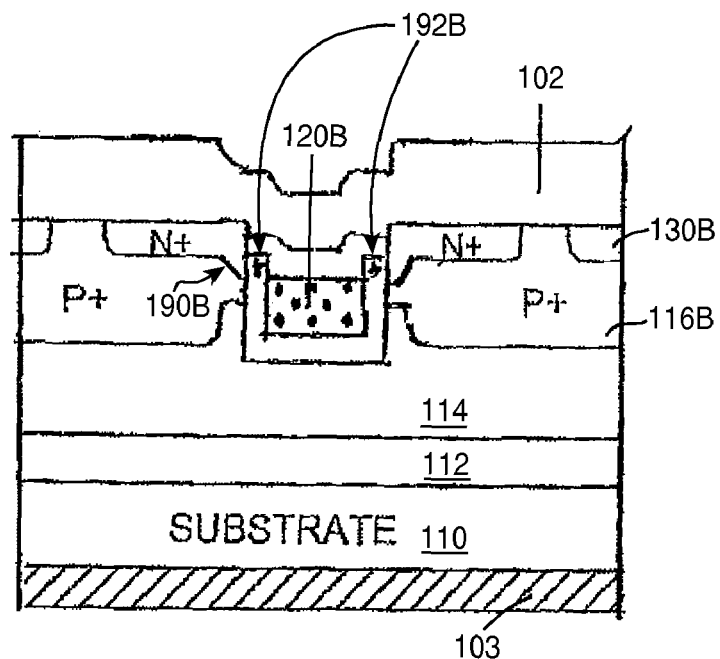
FIG. 1B shows an IGBT with a trench gate and a resistive source extension induced by immobile net electrostatic charge in a dielectric sidewall filament.
Figure 1C:
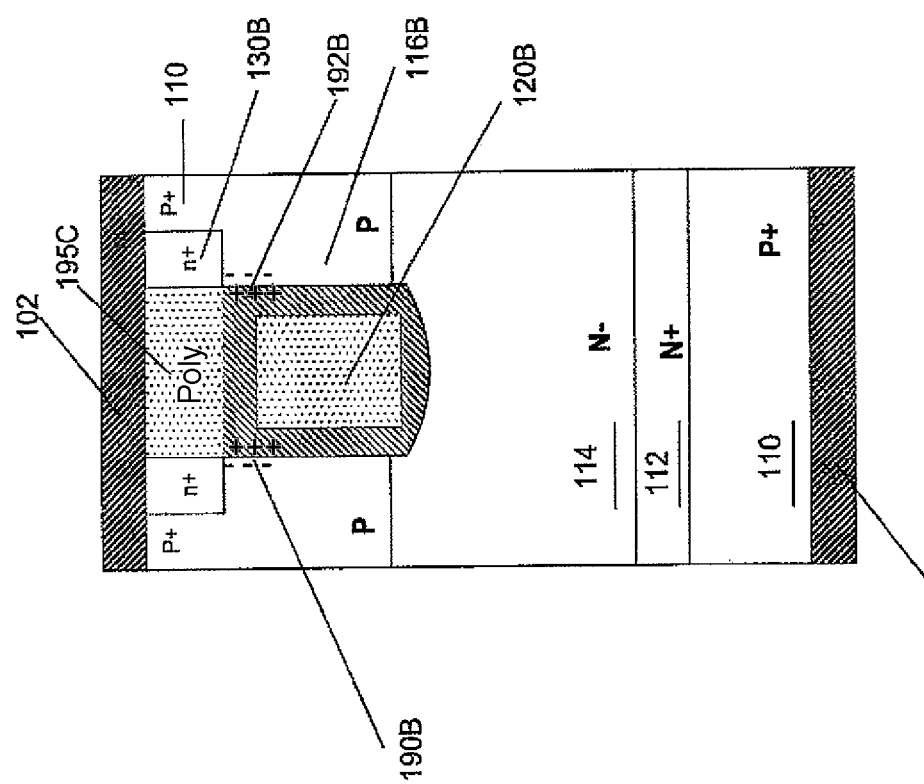
FIG. 1C shows an IGBT with a trench gate, a polycrystalline layer overlying and insulated from the trench gate, a sidewall source, and a resistive source extension induced by immobile net electrostatic charge in dielectric material near an upper corner of said trench gate.

This technique used a resistive source extension that is induced by a region of charge in the oxide layer adjacent to the semiconductor material between the regular source region and the gate. This additional source resistance can be included in either a planar-gate DMOS IGBT as shown in FIG. 1A, or in a trench-gated IGBT as shown in FIG. 1B and FIG. 1C. In each instance, a resistive n-type charge-induced source extension is formed. It is adjacent to the gate of the IGBT on the source side of the gate, and is formed by charge attracted to the semiconductor surface by the permanent charge introduced into the oxide layer adjacent to the source. This permanent charge may be obtained, for instance, by introducing cesium ions into the region of silicon dioxide between the doped source region and the edge of the gate by using ion implantation through a masking layer such as photoresist. (If there is concern about the presence of the cesium atoms, the cesium-doped oxide region may be capped and isolated from other regions of the device, for instance, by a layer of silicon nitride or polycrystalline silicon.) It should be noted that permanent charge may be located in the dielectric material, at the interface between the dielectric material and silicon, inside the silicon material or a combination of the above cases.

FIG. 1A shows details of a first sample embodiment of some of the innovative concepts. In this example, an insulated planar gate 120A inverts a surface (horizontal channel) portion of p-type body/emitter region 116A. (Region 116A will typically have some gradation in doping, corresponding at least to the usual combination of a shallow body implant with a deep body implant, but this gradation is well-known and is not illustrated as such.) Electrons thus emitted from source region 130A pass through the source extension inversion layer induced by immobile net electrostatic charge in a dielectric sidewall filament and then into n-type drift/drain region 114 (provided by an epitaxial layer in this example) into an n+ deep drain region 112. The n+ region 112 forms a base/emitter junction with the p+ substrate 110, to thereby control hole emission which provides hole current between collector contact 103 and emitter/source contact 102. Typical doping and thickness for the epitaxial layer 114 can be, for example, $10^{14}$-$10^{16}$ cm$^{-3}$ with a thickness of 30-100 µm, for an operating voltage of 400-1500 V. (These parameters would be adjusted for different voltage specifications, as is well known to those skilled in the art of power semiconductor devices.)

In the window where metal 102 makes contact to the source region 130A, a charged sidewall filament 192A is adjacent to the patterned polysilicon gate layer 120A. This filament 192 contains sufficient net positive immobile electrostatic charge to weakly invert a portion of the body beneath it, forming an induced source extension region 190A. Note that region 190A, in this example, has essentially the same p-type doping as the channel portion of the body/emitter region 116A, so its metallurgical doping is not n-type. Region 190A is inverted by the immobile positive charge in filament 192A. This is somewhat analogous to the inversion of the channel region, except that the region 190A is ALWAYS inverted (or at least brought to subthreshold conduction) by immobile net charge in a dielectric, whereas the channel is sometimes inverted (and sometimes not) by the mobile net charge in a conductor (i.e. gate 120A).

Figure 7A:
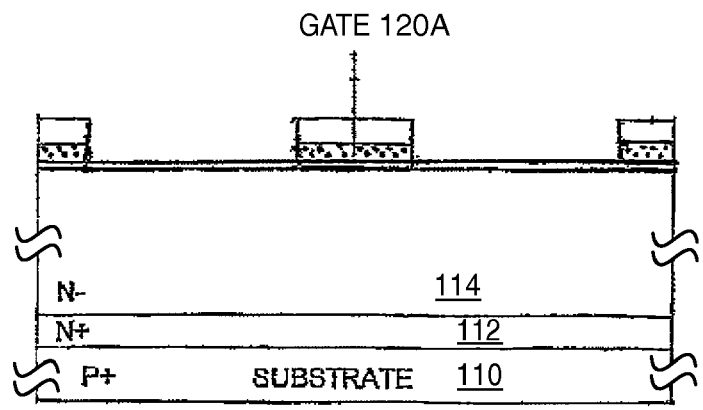
FIGS. 7A, 7B, and 7C show successive steps in fabrication of a device as shown in FIG. 1A.
Figure 7B:
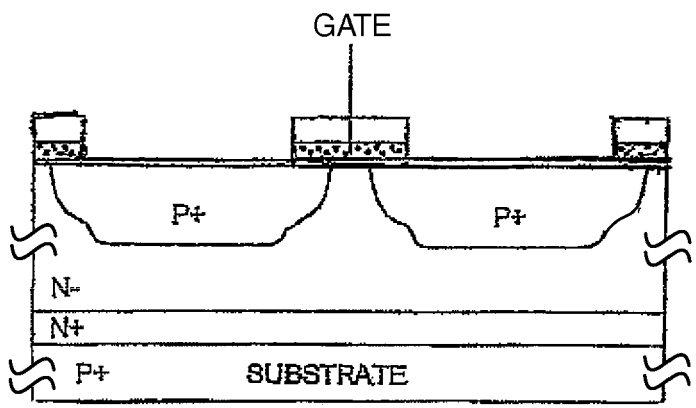
Figure 7C:
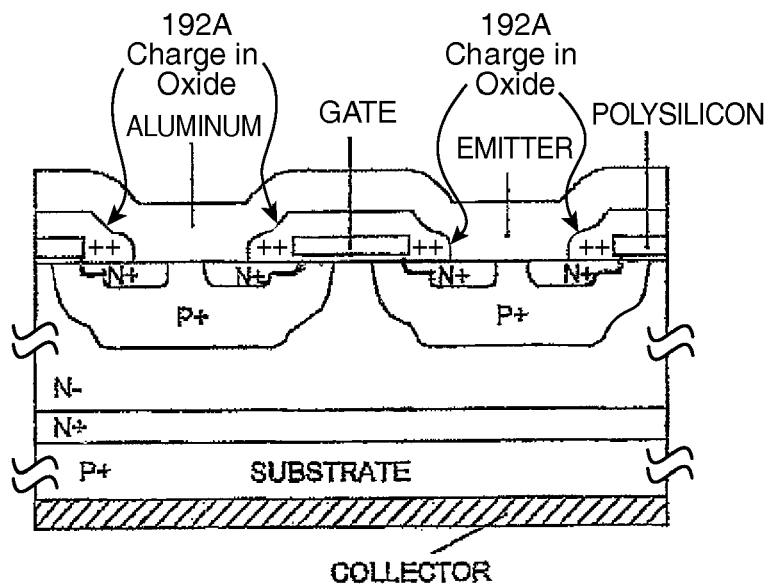

FIGS. 7A-7C show a process sequence for fabrication of the device of FIG. 1A. With a starting n/n+/p+ epitaxial silicon wafer (in this example), field oxidation is performed, e.g. to a thickness of 500-1500 nm. (The field oxide itself is not shown.)

Next, a masked etch is used to expose the active areas.

Next a gate oxidation is performed, to grow a thin gate dielectric to a thickness of 30-200 nm.

Next polysilicon is deposited, doped (possibly at the same time as deposition), patterned and etched. This defines the thin film gate layer, including gates 120A, and opens up the "windows" where the front side metallization will make contact to the source and emitter regions. This results in the structure shown in FIG. 7A.

Next, p-type dopant is preferably introduced and diffused. This can be done, for example, by implanting $BF_2$ with an energy of 20-200 keV and a dose of $10^{13}$ to $5E14$ cm$^{-2}$, following by a heating cycle which provides a lateral diffusion width of about 100-2000 nm. (This implant and diffusion generally corresponds to the shallow body formation step in a conventional DMOS structure.) In addition, a deeper and heavier implant is also preferably used to form a horizontal p+/n− junction beneath the source window. This can be, for example, $10^{15}$ cm$^{-2}$ for a junction depth of 1.5-4.5 µm. These implants are annealed, and optionally some additional time at temperature can be added for drive. This results in the structure shown in FIG. 7B.

Fixed charge is now introduced, e.g. by implanting cesium ions at a dose of $10^{11}$-$10^{13}$ cm$^{-2}$ into areas of gate oxide which have been exposed when the gate stack was etched. Preferably this implant is masked, to keep the Cesium ions out of the field oxide, where they might affect the local breakdown voltage.

Next an undoped insulator, e.g. silicon dioxide or nitride or oxynitride, is conformally deposited followed by depositing a capping layer such as polysilicon or silicon nitride. The fixed charge implant is then annealed using for example a thermal drive such as RTA (Rapid Thermal Anneal) or at 1000 C for 30 minutes. This step is followed by etching the capping layer and anisotropically etching the undoped insulator layer. This clears any remaining portions of the gate oxide from the exposed source/emitter contact windows.

A shallow heavy n-type source doping is now introduced, using a mask to assure that some of the p+ emitter region 116A remains available for contact by metallization. A thermal cycle now activates the source doping and the fixed charge over the induced source extensions.

Silicon dioxide is now deposited to cover all the structures, particularly the gate. This reduces gate-source capacitance, and also provides a dielectric for contact masking.

Frontside and backside metallization layers 102 and 103 are now formed. This results in the structure of FIG. 7C. Processing continues with additional steps of passivation etc., and optionally formation of additional active or passive structures, by methods well known to those skilled in the art.

FIG. 1B shows details of a second sample embodiment of some of the innovative concepts. In this example, the device uses a trench gate 120B instead of the planar gate 120A. This trench gate controllably inverts a vertical channel portion of the body/emitter region 116B. A charged dielectric 192B is present on the sidewalls of the trench, above the top of the gate 120B, and inverts a portion of the body 116B to create an induced source extension 190B. Other elements are generally similar to those in FIG. 1A.

FIG. 1C shows details of a third sample embodiment of some of the innovative concepts. In this example, the device uses a trench gate 120B similar to that of FIG. 1B. This trench gate controllably inverts a vertical channel portion of the body/emitter region 116B. A charged dielectric 192B is present on the sidewalls of the trench, above the top of the gate 120B, and inverts a portion of the body 116B to create an induced source extension 190B. Other elements are generally similar to those in FIG. 1A. The source junction is formed by outdiffusion from the heavily doped polysilicon layer 195C on top of the gate dielectric. This allows the use of very small cell pitch and reduces the device on-resistance.

Figure 8A:
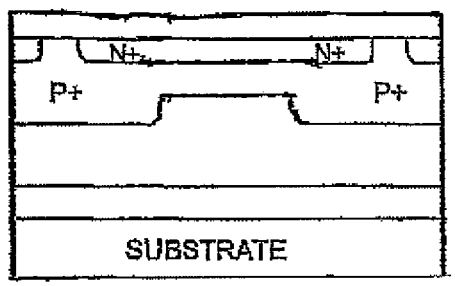
FIGS. 8A, 8B, and 8C show successive steps in fabrication of a device as shown in FIG. 1B.
Figure 8B:
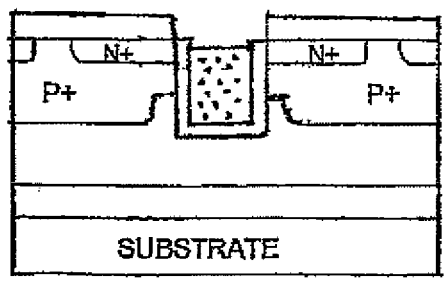
Figure 8C:
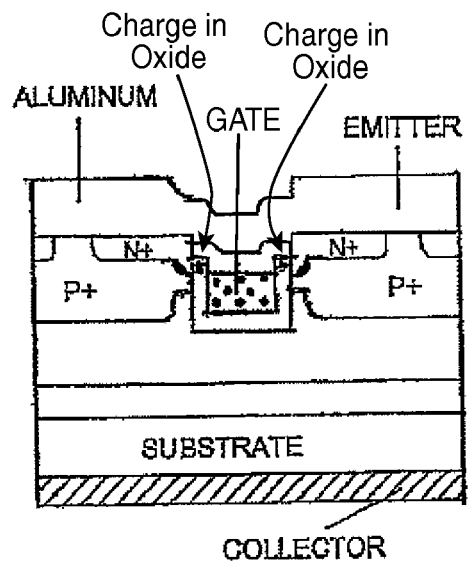

FIGS. 8A-8C show an example of a process sequence for fabrication of the device of FIG. 1B. In this process, field oxidation is performed first, followed by a masked etch to expose the active area. An "implant oxide" is then grown over the active area, and body (p), deep body (p+), and source (n) dopants are implanted and driven in. This results in the unfinished structure of FIG. 8A.

A trench etch is then performed. In this example, note that the trench etch cuts through the n+ source regions and the shallow body locations, but not through the deep body locations. A thin oxide is then grown on the sidewalls of the trench. The gate conductor (polysilicon for example) is then deposited and doped (possibly in the same step). A blanket etchback is then performed, to recess the polysilicon gate electrode below the top of the trench. This process sequence results in the structure of FIG. 8B. (Although the trench is etched after junction formation in the illustrated example, the opposite could also be true.)

A Cs+ angle implant is then performed, to introduce net electrostatic fixed charge into the oxide areas which are exposed above the top corner of the gate electrode. This fixed charge is implanted in sufficient dosage to form an induced source extension 190B as described above.

Additional dielectric (e.g. $SiO_2$) is then deposited to fill the top of the trench, and processing continues with conventional contact and metallization steps. This results in the structure of FIG. 8C.

Diffused Source Extension

Figure 2A:
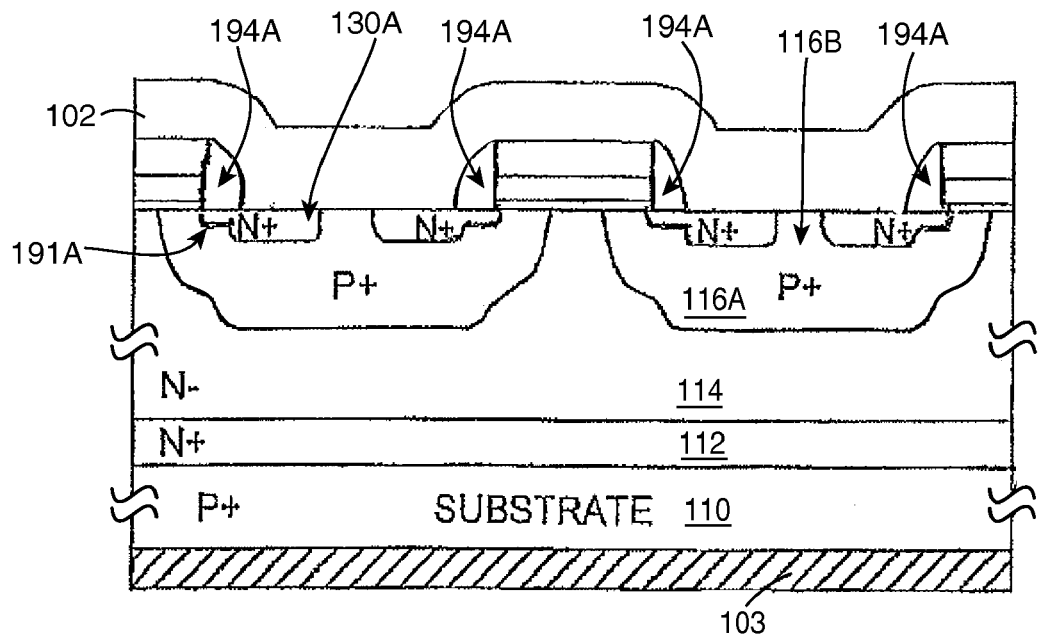
FIG. 2A shows an IGBT with a planar gate and a resistive source extension provided by outdiffusion from a doped sidewall filament.
Figure 2B:
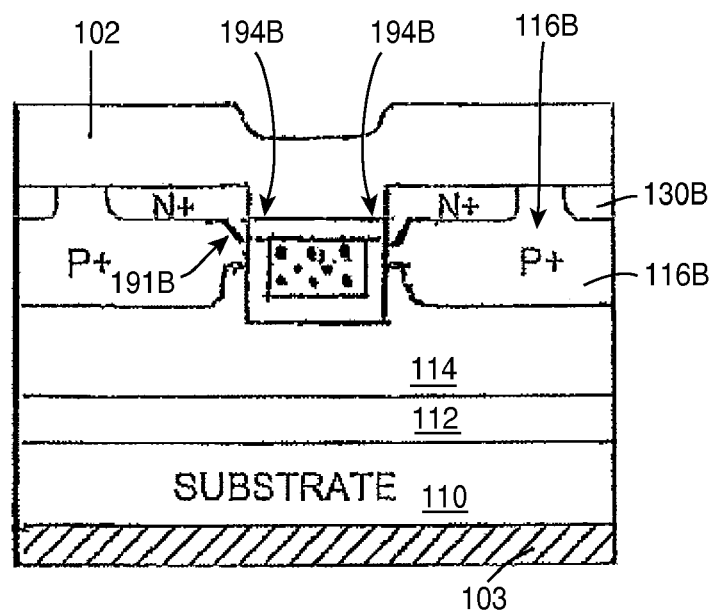
FIG. 2B shows an IGBT with a trench gate and a resistive source extension provided by outdiffusion from a doped sidewall filament.
Figure 2C:
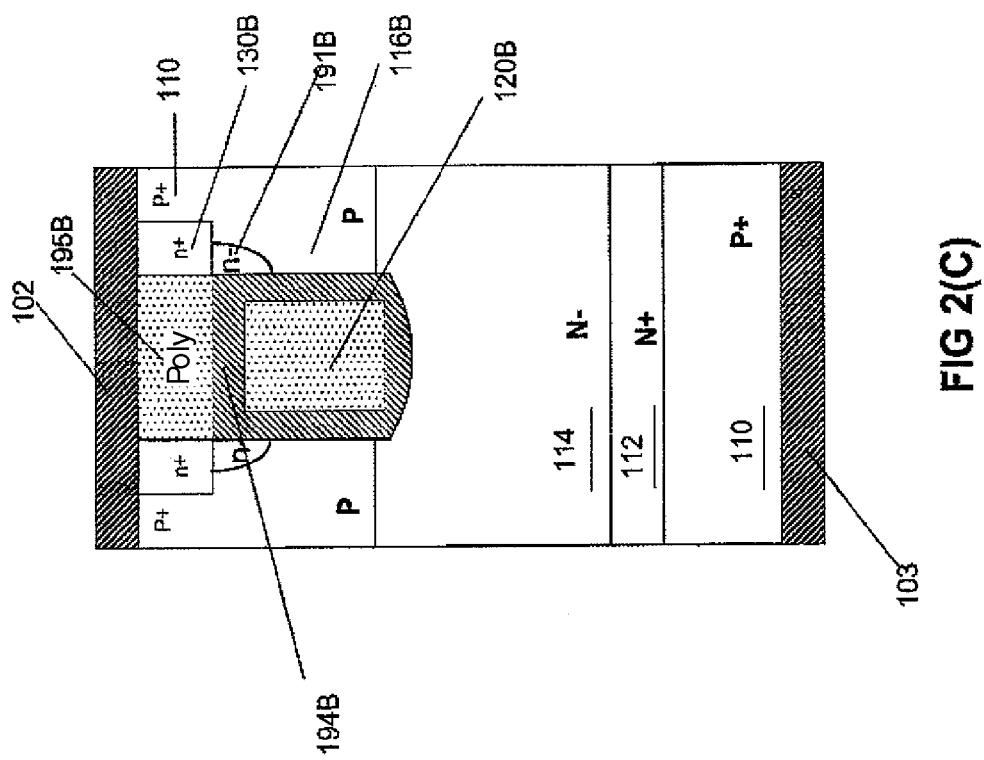
FIG. 2C shows an IGBT with a trench gate, a polycrystalline layer overlying and insulated from the trench gate, a sidewall source, and a resistive source extension near an upper corner of said trench gate.
Figure 3A:
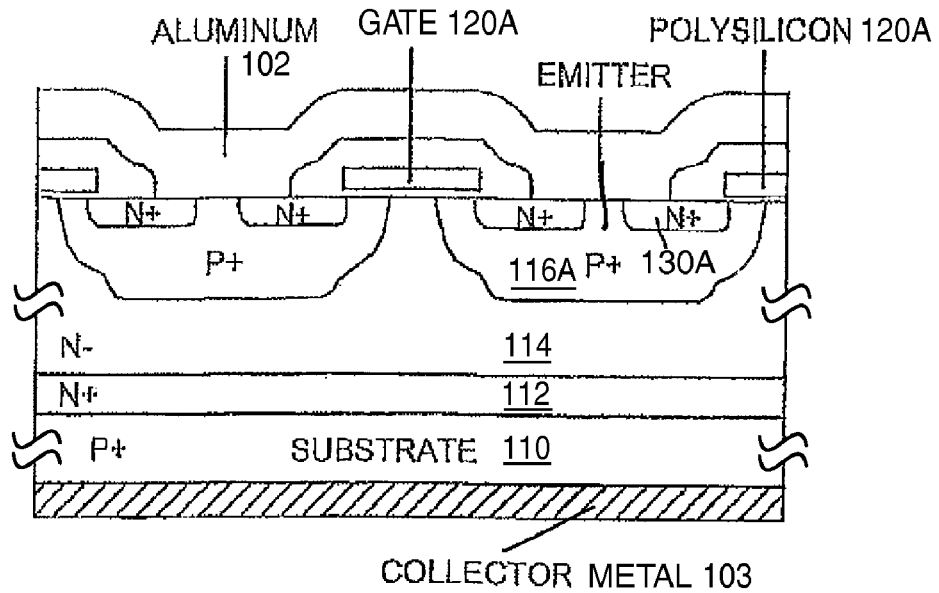
FIG. 3A shows the cross section of a typical n-channel IGBT, and its equivalent circuit is shown in FIG. 3B.
Figure 3B:
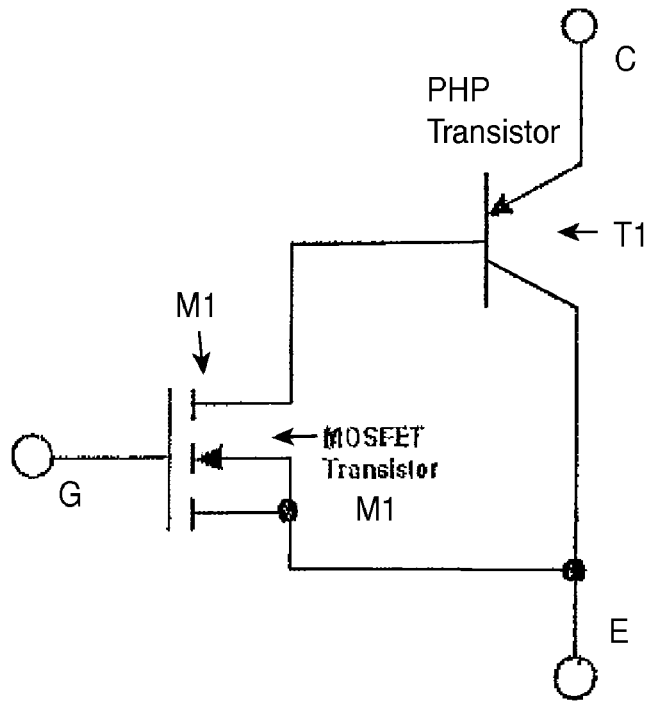
Figure 4B:
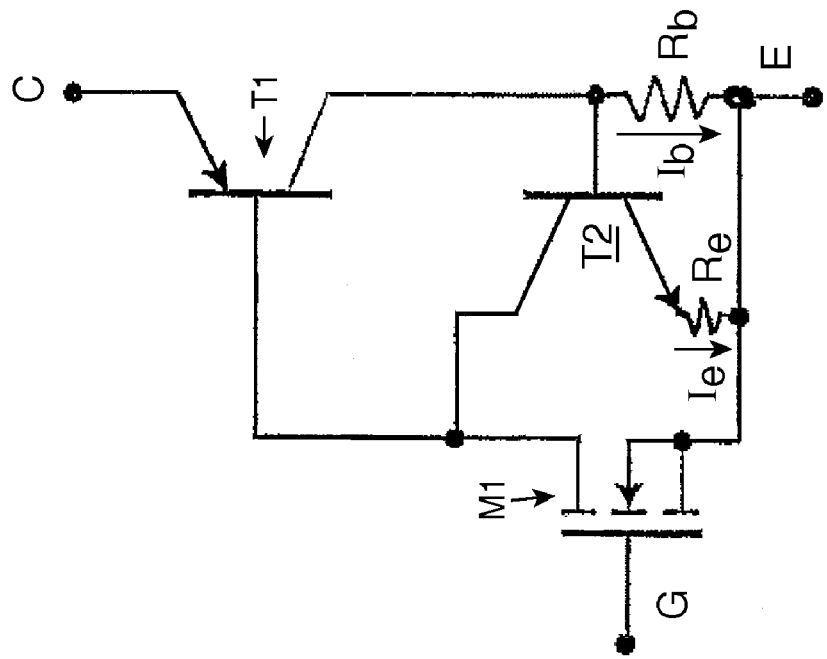
FIGS. 4A and 4B show successively more detailed circuit models of this structure.
Figure 4A:
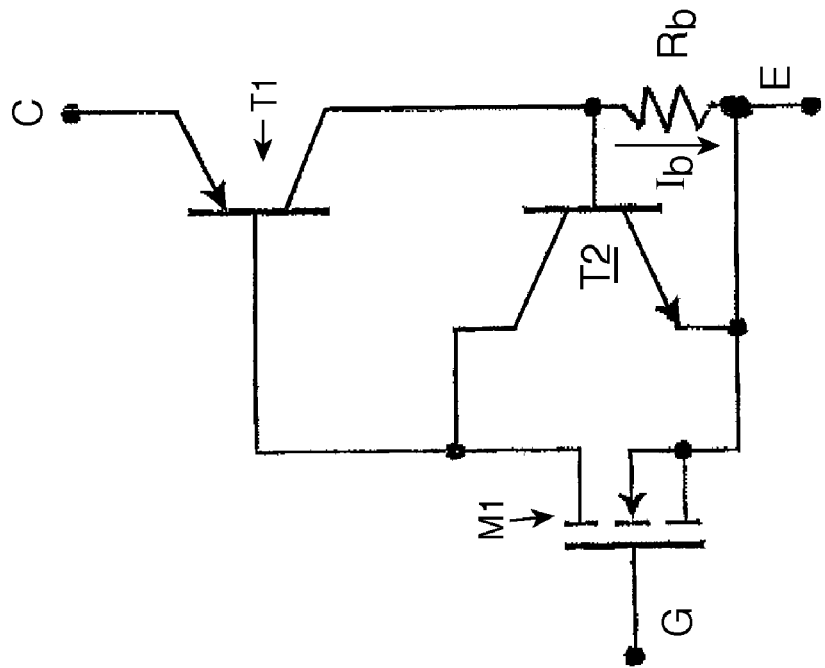

This technique uses a resistive source extension that is created by diffusion from a doped oxide as the source debiasing resistor. This additional source resistance may be included in either a planar-gate structure as shown in FIG. 2A, or in a trench-gated structure as shown in FIG. 2B and FIG. 2C (each described below). In each instance, the resistive extension of the source that is adjacent to or slightly beneath the gate of the IGBT on the source side of the gate is formed by diffusion from a doped oxide layer. This layer of doped oxide is deposited after the gate is formed, a silicide is formed over the gate conductor (if desired), and the silicon region adjacent to the gate is cleared of dielectric. At this time, a layer of silicon dioxide 194B containing the desired dopant atoms (typically phosphorus, arsenic, or boron) is deposited, and the dopant atoms that form the resistive source extension are diffused into the semiconductor material. The amount of dopant diffused into the semiconductor to form the resistive source region may be controlled by adjusting the concentration of the dopant atoms present in the doped oxide, the diffusion time, and the diffusion temperature. The doped oxide region may be obtained using the sidewall spacer technique in the planar DMOS structure before introducing the more heavily doped source region. In the trench-gate IGBT, the doped oxide region may be obtained by depositing a layer of doped oxide above the gate conductor after removing the gate dielectric that is above the source region in the sidewall of the trench. The source region 130B is formed by the outdiffusion of dopants from a polysilicon layer 195C doped with a dopant such as phosphorus. The source contact may subsequently be made by depositing a conductor above this doped oxide region Accordingly, the resistance of the source resistive region may be targeted to a desired value by controlling these parameters. A higher source resistance will produce an IGBT with a greater voltage drop at a given current, but will also require a higher current to undergo latch-up. In addition, IGBTs having a range of device characteristics may be manufactured using the same mask set, using the same process flow.

Figure 5A:
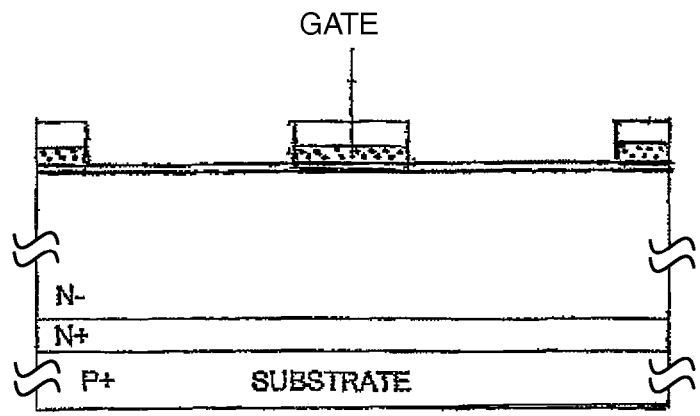
FIGS. 5A, 5B, and 5C show successive steps in fabrication of a device as shown in FIG. 2A.
Figure 5B:
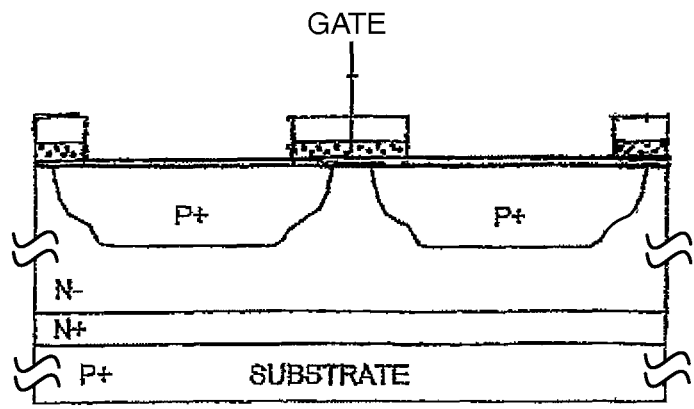
Figure 5C:
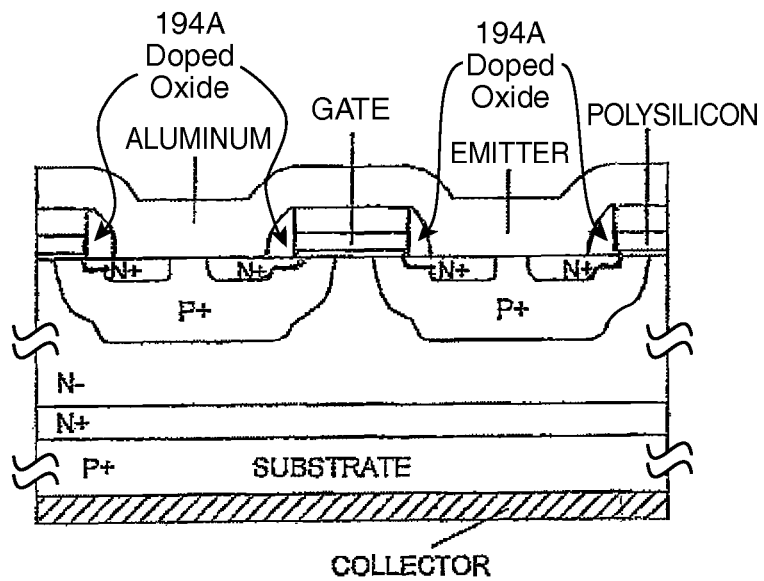

FIGS. 5A, 5B, and 5C show successive steps in fabrication of a device as shown in FIG. 2A. This process is generally quite similar to that shown in FIGS. 7A, 7B, and 7C respectively, except that a dopant-loaded oxide (or other dielectric) 194A is used in place of the charged dielectric 192A. Thus in this example the source extension 191A is actually doped with donors (which have outdiffused from the dopant-loaded oxide 194A), and not merely inverted like the induced source extension 190A.

Figure 6A:
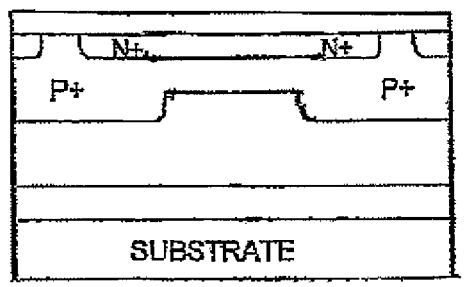
FIGS. 6A, 6B, and 6C show successive steps in fabrication of a device as shown in FIG. 2B.
Figure 6B:
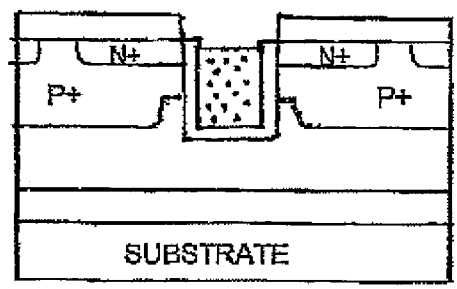
Figure 6C:
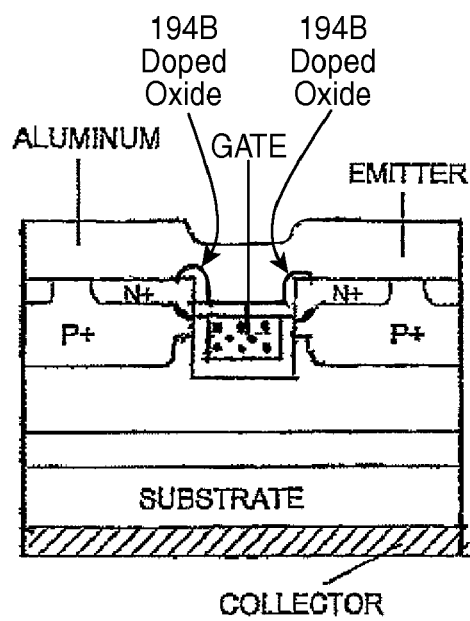

FIGS. 6A, 6B, and 6C show successive steps in fabrication of a device as shown in FIG. 2B. This process is generally similar to that shown in FIGS. 8A, 8B, and 8C respectively, except that a dopant-loaded oxide (or other dielectric) 194B is used in place of the charged dielectric 192B. Thus in this example the source extension 191B is actually doped with donors (which have outdiffused from the dopant-loaded oxide 194B), and not merely inverted like the induced source extension 190B.

FIG. 2C shows yet another sample embodiment of some of the innovative concepts. In this example, the device uses a trench gate 120B similar to that of FIG. 2B. This trench gate controllably inverts a vertical channel portion of the body/emitter region 116B. Outdiffusion from the heavily doped polysilicon layer 195B above the gate, optionally supplemented by additional implantation, provides the dopant atoms which form source extensions 191B on the sidewalls of the trench, below the source 130B and mostly above the top of the gate 120B. Other elements are generally similar to those in FIG. 2A. This embodiment too allows the use of very small cell pitch and reduced device on-resistance.

According to some (but not necessarily all) disclosed embodiments, there is provided: A field-effect-gated bipolar active device, comprising: a source region having a first conductivity type; a body region having a second conductivity type, and surrounding said source region; a gate which is capacitively coupled to said body region, to thereby create a channel portion therein which allows passage of majority carriers from said source region; a source extension region which connects said source region to said channel, and is more resistive than said source region; a drift/drain region which has said first conductivity type, and which is interposed between said body region and a second-conductivity-type collector region; wherein said source extension region is generated by a dielectric layer which contains immobile electrostatic charge.

According to some (but not necessarily all) disclosed embodiments, there is provided: A semiconductor device structure, comprising: a source region having a first conductivity type; a body region having a second conductivity type, and surrounding said source region; a gate which is capacitively coupled to said body region, to thereby create a channel portion therein which allows passage of majority carriers from said source region; a source extension region which connects said source region to said channel, and is more resistive than said source region; a drift/drain region having said first conductivity type, and interposed between said body region and a second-conductivity-type collector region; a first metallization layer connected to said source region and to a second-conductivity-type emitter region which is connected to said body region; and a second metallization layer which is connected to said collector region; wherein said source extension region is generated by a dielectric layer which contains immobile electrostatic charge.

According to some (but not necessarily all) disclosed embodiments, there is provided: A field-effect-gated bipolar active device, comprising: a source region having a first conductivity type; a body region having a second conductivity type, and surrounding said source region; a gate which is capacitively coupled to said body region, to thereby create a channel portion therein which allows passage of majority carriers from said source region; a source extension region which connects said source region to said channel, and has said first conductivity type, and is more resistive than said source region; a drift/drain region which has said first conductivity type, and which is interposed between said body region and a second-conductivity-type collector region; wherein said source extension region lies under a dielectric layer which contains dopant atoms which predominantly correspond to said first conductivity type.

According to some (but not necessarily all) disclosed embodiments, there is provided: A semiconductor device structure, comprising: a source region having a first conductivity type; a body region having a second conductivity type, and surrounding said source region; a gate which is capacitively coupled to said body region, to thereby create a channel portion therein which allows passage of majority carriers from said source region; a source extension region which connects said source region to said channel, and has said first conductivity type, and is more resistive than said source region; a drift/drain region having said first conductivity type, and interposed between said body region and a second-conductivity-type collector region; a first metallization layer connected to said source region and to a second-conductivity-type emitter region which is connected to said body region; and a second metallization layer which is connected to said collector region; wherein said source extension region is generated by a dielectric layer which contains immobile electrostatic charge.

According to some (but not necessarily all) disclosed embodiments, there is provided: A field-effect-gated bipolar active device, comprising: at least one trench penetrating into a semiconductor material, and at least one patterned gate electrode which lies entirely within said trench at some locations, said gate being insulated at a top surface thereof and also at said sidewalls of said trench; a source region having a first conductivity type, and abutting said trench in at least some locations; a body region having a second conductivity type, and surrounding said source region and said trench in at least some locations, and lying beneath said source region in at least some locations; immobile net electrostatic charge, of a net polarity which tends to cause accumulation in semiconductor material of said first conductivity type, located within dielectric material at an upper corner of said gate electrode; said electrostatic charge inverting at least some portions of said body region; a gate which is capacitively coupled to said body region, to thereby create a channel portion therein which allows passage of majority carriers from said source region through said body into a drift/drain region which has said first conductivity type, and which is interposed between said body region and a second-conductivity-type collector region.

According to some (but not necessarily all) disclosed embodiments, there is provided: A field-effect-gated bipolar active device, comprising: at least one trench penetrating into a semiconductor material, and at least one patterned gate electrode which lies entirely within said trench at some locations, said gate being insulated at a top surface thereof and also at said sidewalls of said trench; a source region having a first conductivity type, and abutting said trench in at least some locations; a body region having a second conductivity type, and surrounding said source region and said trench in at least some locations, and lying beneath said source region in at least some locations; a gate which is capacitively coupled to said body region, to thereby create a channel portion therein which allows passage of majority carriers from said source region through said body into a drift/drain region which has said first conductivity type, and which is interposed between said body region and a second-conductivity-type collector region; at least one source extension region of said first conductivity type, having a higher bulk resistivity than said source region, located adjacent said trench within said semiconductor material, and extending between said source region and said channel portion of said body region; wherein said gate electrode lies beneath a polycrystalline region which also lies within said trench, and wherein said polycrystalline region is abutted at sidewalls of said trench by said source region and has the same doping type as said source region.

According to some (but not necessarily all) disclosed embodiments, there is provided: A method for fabricating a field-effect-gated active device structure, comprising the actions, in any order, of: forming at least one patterned gate layer; forming at least one self-aligned dielectric filament on said gate layer, said dielectric filament including immobile net electrostatic charge of a net polarity which tends to cause accumulation in semiconductor material of a first conductivity type; said dielectric filament causing at least one semiconductor region in proximity thereto to become weakly conducting; introducing dopants, at locations not covered by said patterned gate layer nor by said dielectric filament, to create a first-conductivity-type source region which is self-aligned to at least some openings in said gate layer; and introducing second-conductivity-type dopants, at locations not covered by said patterned gate layer, to create a body region which surrounds said source region; and making connections to said body region, to said gate, to said source, and to at least a portion of a back surface of the device, to provide a complete MOS-gated device with bipolar conduction.

According to some (but not necessarily all) disclosed embodiments, there is provided: A method for fabricating a field-effect-gated active device structure, comprising the actions, in any order, of: forming at least one patterned gate layer; forming at least one self-aligned dielectric filament on said gate layer, said dielectric filament including immobile net electrostatic charge of a net polarity which tends to cause accumulation in semiconductor material of a first conductivity type and/or dopants which cause said first conductivity type; said dielectric filament causing at least one semiconductor region in proximity thereto to become weakly conducting; introducing dopants, at locations not covered by said patterned gate layer nor by said dielectric filament, to create a first-conductivity-type source region which is self-aligned to at least some openings in said gate layer; and introducing second-conductivity-type dopants, at locations not covered by said patterned gate layer, to create a body region which surrounds said source region; and making connections to said body region, to said gate, to said source, and to at least a portion of a back surface of the device, to provide a complete MOS-gated device with bipolar conduction.

According to some (but not necessarily all) disclosed embodiments, there is provided: A method for fabricating a field-effect-gated active device structure, comprising the actions, in any order, of: forming at least one trench into a semiconductor material; forming at least one patterned gate electrode having a top surface, in at least some locations, which is within said trench and below a top edge of said trench; said gate being insulated at said top surface and said sidewalls of said trench. Introducing immobile net electrostatic charge of a net polarity which tends to cause accumulation in semiconductor material of a first conductivity type and/or dopants which cause said first conductivity type; said dielectric filament causing at least one semiconductor region in proximity thereto to become weakly conducting; Forming a first-conductivity-type source region which is self-aligned to said trench in at least some locations; Forming a second-conductivity-type body region which surrounds and lies beneath said source region in at least some locations; and making connections to said body region, to said gate, to said source, and to at least a portion of a back surface of the device, to provide a complete MOS-gated device with bipolar conduction.

According to some (but not necessarily all) disclosed embodiments, there is provided: Devices, structures, and related methods for IGBTs and the like which include a self-aligned series resistance at the source-body junction to avoid latchup. The series resistance is achieved by using a charged dielectric, and/or a dielectric which provides a source of donor atoms, at a sidewall adjacent to the source region.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

While an n-channel IGBT has been used to illustrate these new and inventive structures, similar results will be obtained in p-channel IGBTs. Other power MOS-gated devices including conventional DMOS power transistors, trench-gated DMOS power transistors, and other similar devices will also benefit from this performance enhancing technique.

For example, it is contemplated that charged trenches can be included in the drift region, to create induced drain extensions.

For another example, it is contemplated that a PMOS version can use positive charge to deplete a portion of the dopant in the region adjacent to the body, forming the resistive source extension.

For another example, the teaching of the preceding paragraph can be modified to produce an NMOS version which uses negative charge to deplete a portion of the dopant in the region adjacent to the body, thus forming the resistive source extension.

It is also contemplated that other embodiments can use a combination of electrostatic charge and solid-source diffusion to provide resistive source extensions, although this adds to process complexity.

It is also contemplated that other embodiments can use more than one step of deposition/etch to provide a nonhomogeneous sidewall structure. For example, after growth or deposition of a thin oxide layer, and cesium implantation to provide immobile net electrostatic charge, A conformal deposition and anisotropic etchback of a capping layer, such as silicon oxynitride, nitride, dioxide, or other dielectric can then generate filaments which frame the source window (in a stack which includes the charged dielectric layer).

These teachings can also be adapted to MOS transistors, or to other MOS-gated power devices in which latchup is not desired.

It is also contemplated that the above teachings can be adapted to JFET or HEMT devices.

The examples given above are built in silicon, but of course other semiconductor materials can be used instead. Similarly, substitutions can also be made for the specific dielectric and conductive materials referred to above for the various patterned thin film layers.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, disclaimed, or abandoned.

What is claimed is:

1. A field-effect-gated bipolar active device, comprising:
a source region having a first conductivity type;
a body region having a second conductivity type, and surrounding said source region;
a gate which is capacitively coupled to said body region, to thereby create a channel portion therein which allows passage of majority carriers from said source region;
a source extension region which connects said source region to said channel, and is more resistive than said source region;
a drift/drain region which has said first conductivity type, and which is interposed between said body region and a second-conductivity-type collector region;
wherein said source extension region is generated by a dielectric layer which contains immobile net electrostatic charge;
wherein said source extension region has the same predominant dopant type as said body region, but is in inversion.

2. The device of claim 1, wherein said first conductivity type is n-type.

3. The device of claim 1, wherein said dielectric layer is inhomogeneous.

4. The device of claim 1, wherein said dielectric layer is primarily composed of silicon dioxide.

5. The device of claim 1, wherein said body region and said drift/drain region consist primarily of silicon.

6. The device of claim 1, wherein said gate and said channel are substantially planar.

7. The device of claim 1, wherein said gate is a trench gate, and said channel is substantially vertical.

8. The device of claim 1, wherein said gate is isolated from said body by a grown dielectric layer.

9. The device of claim 1, wherein said gate is a patterned thin film layer, and said dielectric layer is a filament which runs along at least some sidewalls of said gate.

10. A semiconductor device structure, comprising:
a source region having a first conductivity type;
a body region having a second conductivity type, and surrounding said source region;
a gate which is capacitively coupled to said body region, to thereby create a channel portion therein which allows passage of majority carriers from said source region;
a source extension region which connects said source region to said channel, and is more resistive than said source region;
a drift/drain region having said first conductivity type, and interposed between said body region and a second-conductivity-type collector region;
a first metallization layer connected to said source region and to a second-conductivity-type emitter region which is connected to said body region; and
a second metallization layer which is connected to said collector region;
wherein said source extension region is generated by a dielectric layer which contains immobile net electrostatic charge;
wherein said source extension region has the same predominant dopant type as said body region, but is in inversion.

11. The device of claim 10, wherein said first conductivity type is n-type.

12. The device of claim 10, wherein said gate is a trench gate, and said channel is substantially vertical.

13. The device of claim 10, wherein said gate is a patterned thin film layer, and said dielectric layer is a filament which runs along at least some sidewalls of said gate.

14. A field-effect-gated bipolar active device, comprising:
a source region having a first conductivity type;
a body region having a second conductivity type, and surrounding said source region;
a gate which is capacitively coupled to said body region, to thereby create a channel portion therein which allows passage of majority carriers from said source region;
a source extension region which connects said source region to said channel, and has said first conductivity type, and is more resistive than said source region;
a drift/drain region which has said first conductivity type, and which is interposed between said body region and a second-conductivity-type collector region;
wherein said source extension region lies under a dielectric layer which contains dopant atoms which predominantly correspond to said first conductivity type.

15. The device of claim 14, wherein said gate and said channel are substantially planar.

* * * * *